United States Patent
Yang et al.

(10) Patent No.: US 7,687,920 B2
(45) Date of Patent: Mar. 30, 2010

(54) INTEGRATED CIRCUIT PACKAGE-ON-PACKAGE SYSTEM WITH CENTRAL BOND WIRES

(75) Inventors: DeokKyung Yang, Hanam-si (KR); Jae Han Chung, Ichon-si (KR); Hyun Joung Kim, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/101,961

(22) Filed: Apr. 11, 2008

(65) Prior Publication Data

US 2009/0256267 A1    Oct. 15, 2009

(51) Int. Cl.
*H01L 23/48* (2006.01)

(52) U.S. Cl. .................. 257/777; 257/723; 257/685; 257/E25.005; 257/E25.006; 257/E25.021; 257/E25.027; 257/E23.083

(58) Field of Classification Search ................ 257/685, 257/686, 693, 723, 777, E25.005, E25.006, 257/E25.021, E25.027, E23.083
See application file for complete search history.

(56) References Cited

U.S. PATENT DOCUMENTS

| | | | |
|---|---|---|---|
| 5,243,497 A | 9/1993 | Chiu | |
| 6,227,215 B1 * | 5/2001 | Akazawa | 134/169 C |
| 6,555,919 B1 | 4/2003 | Tsai et al. | |
| 6,787,895 B1 | 9/2004 | Jarcy et al. | |
| 6,807,731 B2 | 10/2004 | Brandenburg et al. | |
| 6,836,007 B2 | 12/2004 | Michii et al. | |
| 6,869,827 B2 * | 3/2005 | Vaiyapuri | 438/109 |
| 6,919,631 B1 | 7/2005 | Hoffman et al. | |
| 6,977,427 B2 * | 12/2005 | Hetzel et al. | 257/676 |
| 7,005,316 B2 | 2/2006 | Lee et al. | |
| 7,129,586 B2 * | 10/2006 | Kashiwazaki | 257/778 |
| 7,205,656 B2 | 4/2007 | Kim et al. | |
| 7,262,080 B2 | 8/2007 | Go et al. | |
| 7,309,913 B2 | 12/2007 | Shim et al. | |
| 7,332,372 B2 | 2/2008 | Derderian | |
| 7,528,475 B2 * | 5/2009 | Go et al. | 257/686 |
| 2003/0164550 A1 * | 9/2003 | Lee et al. | 257/777 |
| 2003/0205801 A1 * | 11/2003 | Baik et al. | 257/686 |
| 2004/0262773 A1 * | 12/2004 | Joh et al. | 257/777 |
| 2007/0273023 A1 | 11/2007 | Zhao et al. | |
| 2007/0278696 A1 | 12/2007 | Lu et al. | |

OTHER PUBLICATIONS

Dr. Kevin Becker & Timmy Lin, Printable Die Attach Adhesives for Substrate-On-Chip Packaging, Ablestick, 2007, http://www.ablestik.com/pdfs/Printable%20DA%20Adhesives.pdf.

* cited by examiner

*Primary Examiner*—Jasmine J Clark
(74) *Attorney, Agent, or Firm*—Mikio Ishimaru

(57) ABSTRACT

An integrated circuit package-on-package system includes: providing a base substrate having a central opening; attaching a bottom die below the base substrate partially covering the central opening, the bottom die connected through the central opening to a top surface of the base substrate; attaching a top die above the base substrate partially covering the central opening; attaching external conductive interconnections to a base bottom surface of the base substrate; and molding an encapsulant leaving the external conductive interconnections partially exposed.

22 Claims, 7 Drawing Sheets

INTEGRATED CIRCUIT PACKAGE-ON-PACKAGE SYSTEM WITH CENTRAL BOND WIRES

TECHNICAL FIELD

The present invention relates generally to an integrated circuit package and more particularly to an integrated circuit package-on-package system.

BACKGROUND ART

Across all sectors, industries, and geographies, demands continue for the electronic industry to provide products that are lighter, faster, smaller, multi-functional, more reliable, and more cost-effective. In order to meet these expanding requirements of so many and varied consumers, more electrical circuits need to be more highly integrated to provide the demanded functions. Across virtually all applications, there continues to be growing demand for reducing size, increasing performance, and improving features of integrated circuits.

The seemingly endless restrictions and requirements are no more visible than with products in our daily lives. Smaller and denser integrated circuits are required in many portable electronic products, such as cell phones, portable computers, voice recorders, etc. as well as in many larger electronic systems, such as cars, planes, industrial control systems, etc.

As the demand grows for smaller electronic products with more features, manufacturers are seeking ways to include more features as well as reduce the size of the integrated circuits. However, increasing the density of integration in integrated circuits may be expensive and have technical limitations. Though technology continues its growth to once unimagined extents, practical limits of individual integrated circuits do exist.

To meet these needs, three-dimensional type integrated circuit packaging techniques have been developed and used. Packaging technologies are increasingly using smaller footprints with more circuits in three-dimensional packages. In general, package stacks made by stacking packages and stacked chip packages made by stacking chips in a package have been used.

In integrated circuit packaging, in addition to component reduction, surface mount technology has demonstrated an increase in semiconductor chip density on a single substrate or board, resulting from more compact designs and footprint and a significant increase in integrated circuit density. However, greater integrated circuit density is becoming significantly limited by the space available for the mounting of semiconductor dice on a carrier substrate.

Stack semiconductor packages are advanced packaging technology, which is characterized by stacking a plurality of chips in a single package structure, so as to desirably multiply operational performances and memory capacity for semiconductor packages.

However, when stacking a plurality of chips in a single package structure, the bonding wires may be subject to wire sagging or sweeping due to strong mold-flow impact of a molding compound. Wire sweep would cause electrical contact or short circuit between adjacent bonding wires or between bonding wires and chips, causing damage to the stacked semiconductor package.

Moreover, when stacking multiple chips on top of each other, different sets of bonding wires extend laterally to reach different areas on the substrate outside the underlying chips. This increases the occupied area on the substrate.

Furthermore, the wire loops of the bonding wires bonded to the overlying chip are adapted in elevation to allow the wire lateral extension to reach farther than the bonding wires bonded to the underlying chip. This increases the height or the thickness of the stacked integrated circuit packages.

In the Board on Chip (BOC) assembly, a first semiconductor device may be attached active face down on the surface of a substrate with bond wires extending through a substrate opening from bond pads on the bottom of the substrate to central bond pads on the active surface of the semiconductor device. A second similar semiconductor device is bonded back-to-back on the first semiconductor device. The central bond pads on the second semiconductor device require long bond wires to connect to the substrate at the periphery of the second semiconductor device. An encapsulant is used to cover the bond wires to prevent contamination.

A method for forming stacked semiconductor device assemblies, which enables the use of shorter bond wires, and a substrate smaller relative to the size of the semiconductor devices has been long sought. Similarly, a method for further reducing the overall height (thickness) of the BOC stacked structure has been long sought.

Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package-on-package system includes: providing a base substrate having a central opening; attaching a bottom die below the base substrate partially covering the central opening, the bottom die connected through the central opening to a top surface of the base substrate; attaching a top die above the base substrate partially covering the central opening; attaching external conductive interconnections to a base bottom surface of the base substrate; and molding an encapsulant leaving the external conductive interconnections partially exposed.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
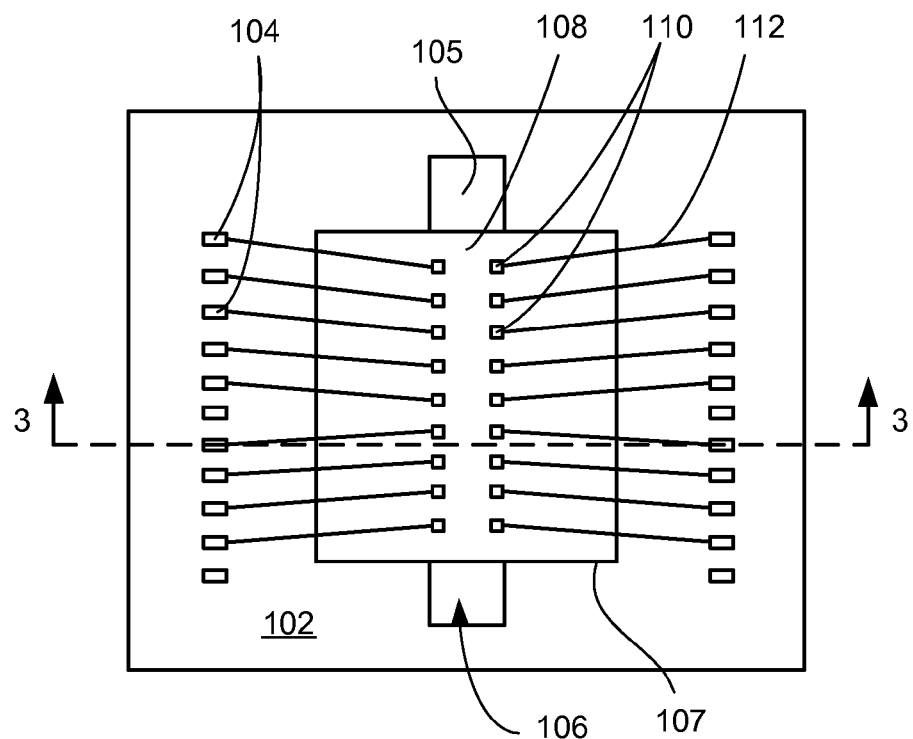
FIG. 1 is a top view of an integrated circuit package-on-package system with an encapsulant removed in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. Similarly, although the views in the drawings for ease of description generally show similar orientations, this depiction in the FIGs. is arbitrary for the most part.

In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the base substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure.

The term "system" as used herein refers to and is defined as the method and as the apparatus of the present invention in accordance with the context in which the term is used.

Referring now to FIG. 1, therein is shown a top view of an integrated circuit package-on-package system 100 with an encapsulant removed in a first embodiment of the present invention.

The top view of the integrated circuit package-on-package system 100 includes a base substrate 101.

The base substrate 101 has a base top surface 102. The base substrate 101 can be made of many different materials, such as laminate substrate, ceramic, metal leadframe, or other materials.

The base substrate 101 has the base top surface 102 having bond fingers 104 placed in a single row arrangement along two opposite sides of the four sides of the base top surface 102.

The two rows of the bond fingers 104 are opposite to each other. It is an option to place the bond fingers 104 in a staggered configuration.

A central opening 106, which may be of rectangular shape, is cut through the central area of the base top surface 102 extending beyond a top die 107 by spaces 105. The spaces 105 are provided to allow encapsulant flow around and under the top die 107 and the base substrate 101.

The top die 107 has a top die active side 108 with inner central bond pads 110 are arranged in the central area of the top die active side 108 on two parallel rows facing each other.

For illustrative purposes the inner central bond pads 110 are facing each other, although it is understood that the inner central bond pads 110 could be arranged in a staggered configuration on two or more parallel rows.

To establish electrical interconnection between the bond fingers 104 of the base top surface 102 and the inner central bond pads 110 of the top die active side 108, top die electrical interconnections 112, such as bond wires, are routed from the inner central bond pads 110 to a corresponding number of the bond fingers 104.

Figure 2:
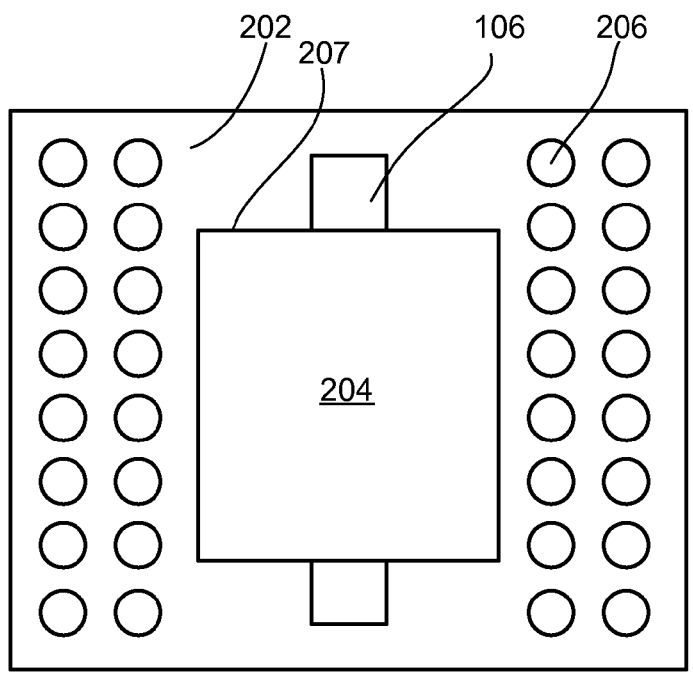
FIG. 2 is a bottom view of the integrated circuit package-on-package system of FIG. 1.

Referring now to FIG. 2, therein is shown a bottom view of the integrated circuit package-on-package system of FIG. 1.

The bottom view of the integrated circuit package-on-package system 100 depicts a base bottom surface 202 having the central opening 106 and external conductive interconnections 206, such as solder balls.

The external conductive interconnections 206 are arranged in two parallel rows near the perimeter of two opposite of the four sides of the base bottom surface 202 such that there are two rows on each of the two sides. The two rows of the external conductive interconnections 206 are parallel with each other and facing each other.

It is understood that the two rows of the external conductive interconnections 206 can be arranged such that the external conductive interconnections 206 on one row are staggered with respect to the external conductive interconnections 206 on the second row.

The external conductive interconnections 206 provide electrical connections between the base substrate 101 and the next level of system, such as a printed circuit board (not shown).

A bottom die 207 partially covers the central opening 106 and has a bottom non-active side 204.

Figure 3:
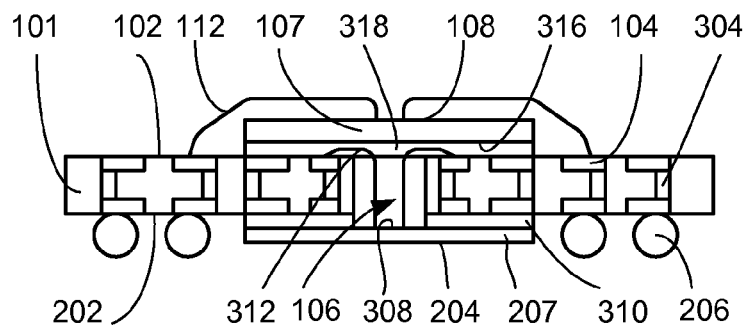
FIG. 3 is a cross-sectional view of the integrated circuit package-on-package system along line 3-3 of FIG. 1 with the encapsulant removed.

Referring now to FIG. 3, therein is shown a cross-sectional view of the integrated circuit package-on-package system 100 along line 3-3 of FIG. 1 with the encapsulant removed.

The integrated circuit package-on-package system 100 includes the base substrate 101 having the bond fingers 104 on the base top surface 102 and base electrical connectors 304, such as metallic vias within the base substrate 101. In some embodiments, the bond fingers 104 are connected by wire traces (not shown).

The base substrate 101 includes the external conductive interconnections 206 on the base bottom surface 202 to provide electrical connection between the base substrate 101 and the next level of system, such as a printed circuit board (not shown).

The bottom die 207, having a bottom die active side 308 and the bottom die non-active side 204, is mounted on the base bottom surface 202 of the base substrate 101 such that the bottom die 207 sits between the rows formed by the external conductive interconnections 206 and the bottom die active side 308 partially covers the central opening 106 creating a floor for the central opening 106.

In a non-deformed pre-reflow state, the external conductive interconnections 206 extend a greater distance from the base bottom surface 202 of the base substrate 101 than the bottom die 207.

The bottom die 207 is attached on the base bottom surface 202 of the base substrate 101 using a first attachment material 310, such as a thermally conductive adhesive.

The bottom die 207 is electrically coupled to the base substrate 101 using bottom die electrical interconnections 312, such as bond wires. The bottom die electrical interconnections 312 are directed through the central opening 106 from the bottom die active side 308 of the bottom die 207 and are connected to the bond fingers 104 on the base top surface 102 of the base substrate 101.

The top die 107 having the top die active side 108 and a top die non-active side 316 is mounted on the base top surface 102 of the base substrate 101 partially covering the central opening 106 creating a lid for the central opening 106.

The top die active side 108 is electrically coupled to the base substrate 101 using the top die electrical interconnections 112. The top die non-active side 316 is attached to the base substrate 101 using a first wire-in-film adhesive 318.

The first wire-in-film adhesive 318 has a low viscosity and, as temperature increases, the viscosity gets lower. Therefore, the first wire-in-film adhesive 318 can be easily pressed over the bottom die electrical interconnections 312 that become partially embedded into the first wire-in-film adhesive 318 and then cured to harden the first wire-in-film adhesive 318. The first wire-in-film adhesive 318 closes off a portion of the central opening 106. The first wire-in-film adhesive 318 is made of a B-stage material that can be hardened after curing and can maintain a predetermined thickness.

For the board-on-chip package, it is critical that the die attach method provides precise control of the bond line thickness and prevent contamination of the wire bonding interconnection. The term "bond line thickness" as used herein refers to the thickness of the first wire-in-film adhesive 318 used to attach the top die 107 to the base substrate 101.

To address this issue, the first wire-in-film adhesive 318, such as a B-stage material, is used to attach the top die 107 to the base top surface 102 of the base substrate 101.

It has been discovered that the first wire-in-film adhesive 318 has a low viscosity and, as temperature increases, the viscosity gets lower. At the die bonding stage (temperature about 100° C.) before curing, the viscosity can be in a range of 10 to 100 Pa·s.

It has also been discovered that the elastic modulus of the first wire-in-film adhesive 318 before curing (B-stage) is less than 300 MPa, and it should be greater than 300 MPa after curing. The elastic modulus also drops as temperature increases before and after curing.

It has also been discovered that, by using the first wire-in-film adhesive 318, the assembly process for attaching the top die 107 is simplified.

It has also been discovered that the thickness of the first wire-in-film adhesive 318 should be at least 20 μm (microns) over the loop height of the bottom die electrical interconnections 312. The first wire-in-film adhesive 318 is capable of keeping a defined bond line thickens.

In a conventional package-on-package system, a second integrated circuit die is usually stacked on top of a first integrated circuit die, reducing the horizontal dimension of the integrated circuit package, namely, the x-y dimension of the package in the horizontal plane. There is a continuous call for reducing the height or thickness, namely, the z dimension of the package in the vertical plane.

When stacking multiple chips on top of each other, different sets of bonding wires extend laterally to reach different areas on the substrate outside the underlying chips. This increases the occupied area on the substrate.

Furthermore, the wire loops of the bonding wires bonded to the overlying chip are adapted in elevation to allow the wire lateral extension to reach farther than the bonding wires bonded to the underlying chip. This increases the height or the thickness of the stacked integrated circuit packages.

It has been discovered that mounting the bottom die 207 on the base bottom surface 202 of the base substrate 101, the height of the package-on-package system can be reduced since the bottom die 207 is mounted between the external conductive interconnections 206. As a result, the bottom die 207 does not take any additional space in the vertical direction.

It has also been discovered that directing the bottom die electrical interconnections 312, such as bond wires, through the central opening 106, makes it possible for the shortest wire bond connection.

Figure 4:
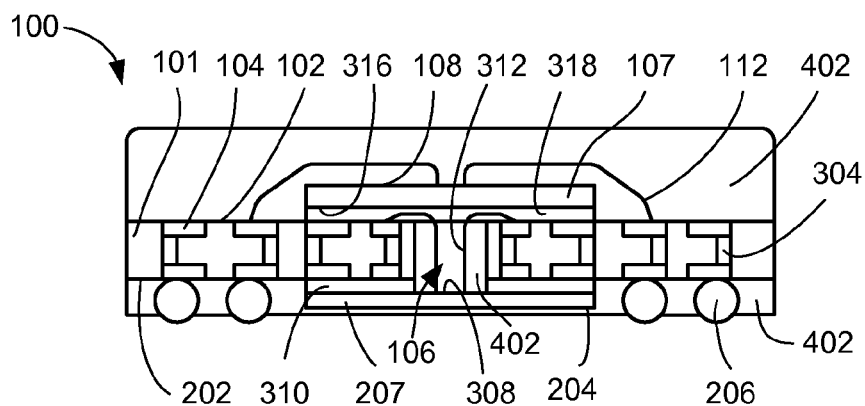
FIG. 4 is a cross-sectional view of the encapsulated integrated circuit package-on-package system in the first embodiment of the present invention.

Referring now to FIG. 4, therein is shown a cross-sectional view of the encapsulated integrated circuit package-on-package system 100 in the first embodiment of the present invention.

A molding compound or an encapsulant 402, such as an epoxy resin, encapsulates the top die 107 and the top die electrical interconnections 112. The encapsulant 402 then flows into the central opening 106 along the sides of the top die 107 to partially encapsulate the bottom die electrical interconnections 312 and partially encapsulate the external conductive interconnections 206.

It has also been discovered that having both the top die electrical interconnections 112 and the bottom die electrical interconnections 312 attached to the bond fingers 104 on the base top surface 102 of the base substrate 101, the length of the conductive traces (not shown) on the base substrate 101 can be reduced and the input/output count of the substrate can be simplified. This makes the manufacturing process for the base substrate 101 easier.

It has also been discovered that the height of the integrated circuit package-on-package system 100 can be reduced by having the bottom die electrical interconnections 312 directed through the central opening 106 and embedded in the first wire-in-film adhesive 318. Similarly, it has been discovered by having the bottom die 207 mounted between the external conductive interconnections 206, the thickness or the vertical dimension of the integrated circuit package-on-package system 100 is also reduced.

Figure 5:
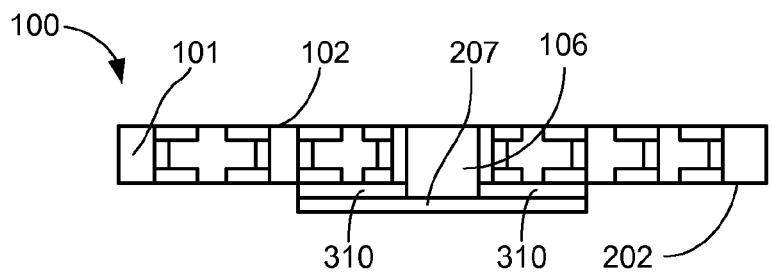
FIG. 5 is the structure of FIG. 4 in an intermediate mounting step of manufacture in the first embodiment of the present invention.

Referring now to FIG. 5, therein is shown the structure of FIG. 4 in an intermediate mounting step of manufacture in the first embodiment of the present invention.

The bottom die 207 is attached to the base substrate 101 below the central opening 106 partially covering the central opening 106.

Figure 6:
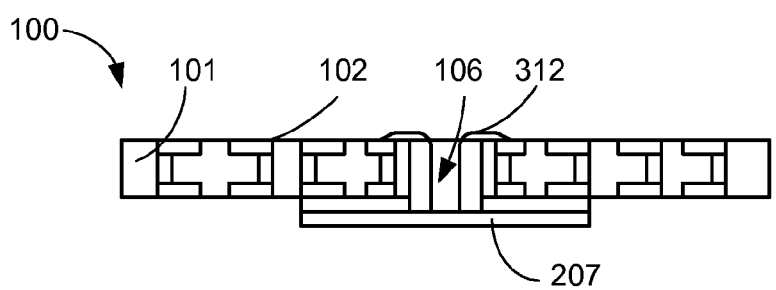
FIG. 6 is the structure of FIG. 5 in a wire bonding step of manufacture.

Referring now to FIG. 6, therein is shown the structure of FIG. 5 in a wire bonding step of manufacture.

The bottom die 207 is electrically coupled to the base substrate 101 using the bottom die electrical interconnections 312, such as bond wires. The bottom die electrical interconnections 312 are directed from the bottom die active side 308 of the bottom die 207 to the base top surface 102 of the base substrate 101 through the central opening 106.

Figure 7:
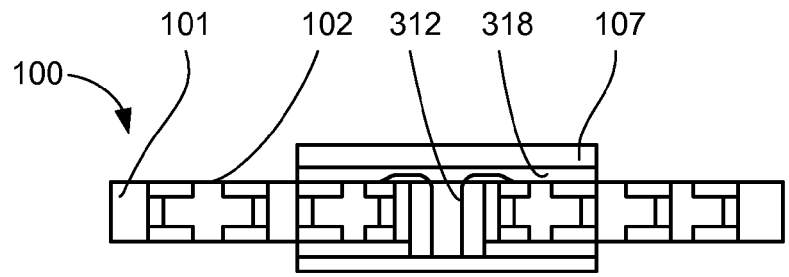
FIG. 7 is the structure of FIG. 6 in a die attach step of manufacture.

Referring now to FIG. 7, therein is shown the structure of FIG. 6 in a die attach step of manufacture.

The top die 107 is attached to the base substrate 101 using the first wire-in-film adhesive 318. The top die 107 is pressed down until the bottom die electrical interconnections 312 are partially embedded in the first wire-in-film adhesive 318.

Figure 8:
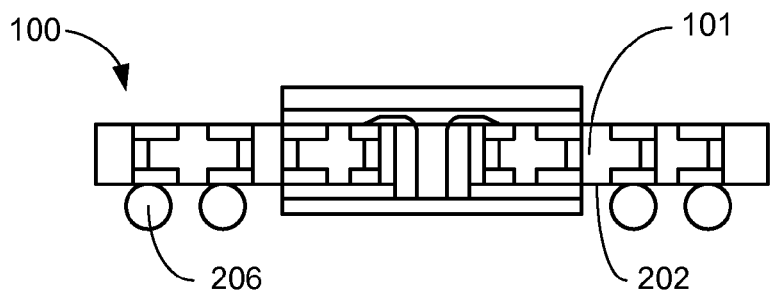
FIG. 8 is the structure of FIG. 7 in a solder ball mount step of manufacture.

Referring now to FIG. 8, therein is shown the structure of FIG. 7 in a solder ball mount step of manufacture.

The external conductive interconnections 206, such as solder balls, are mounted on the base bottom surface 202 of the base substrate 101.

It has been discovered that in the reflowing process of the external conductive interconnections 206, a no clean type of flux should be used. One of the reasons to use the no clean type of flux is that the reflow process is followed by a flux residue cleaning process, which is done with de-ionized water and the water is able to penetrate through the central opening 106 (necessary for mold flow) and cause contamination of the bottom die electrical interconnections 312, such as bond wires, that electrically connect the bottom die 207 to the base substrate 101.

Figure 9:
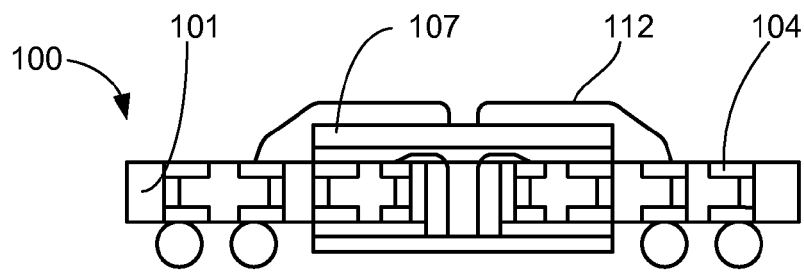
FIG. 9 is the structure of FIG. 8 in a wire bonding step of manufacture.

Referring now to FIG. 9, therein is shown the structure of FIG. 8 in a wire bonding step of manufacture.

The top die 107 is electrically coupled to the bond fingers 104 on the base top surface 102 of the base substrate 101 using the top die electrical interconnections 112 from the center of the top die 107.

Figure 10:
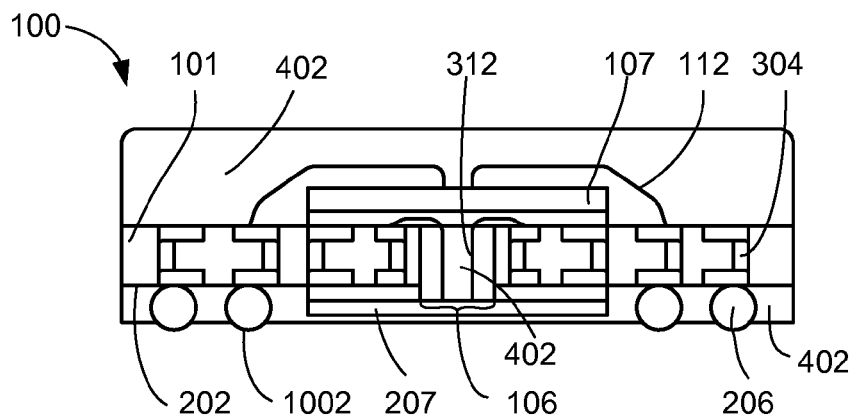
FIG. 10 is the structure of FIG. 9 in an encapsulation step of manufacture in the first embodiment of the present invention.

Referring now to FIG. 10, therein is shown the structure of FIG. 9 in an encapsulation step of manufacture in the first embodiment of the present invention.

The encapsulant 402 is molded to encapsulate the bottom die 207, the top die 107, and the top die electrical interconnections 112, filling the central opening 106. The encapsulant 402 partially encapsulates the external conductive interconnections 206.

In this encapsulation method, a roll of encapsulant foil, such as a film, is incorporated into a film assisted molding equipment ("FAME") mold press to cover portions of the external conductive interconnections 206 so they will be only be partially encapsulated.

The base substrate 101, with all the attached components thereon, is loaded onto a bottom mold case. The top mold case has vacuum suction holes drilled in it to hold the encapsulant film in place during the molding process and to release moisture trapped in the encapsulant during molding. The encapsulant film is then adhered over the base substrate 101 by undergoing a molding transfer process using the film assisted molding equipment.

The encapsulant 402 hermetically covers the top die 107 and the bottom die 207, the top die electrical interconnections 112, fills the central opening 106, and partially encapsulates the bottom die electrical interconnections 312 and the external conductive interconnections 206.

The external conductive interconnections 206 have exposed surfaces 1002 in the molded surface of the encapsulant 402 to allow electrical and mechanical attachment to the next level of system, such as a printed circuit board (not shown).

Figure 11:
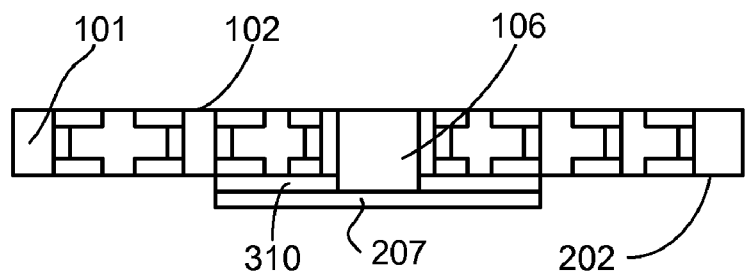
FIG. 11 is the structure of FIG. 4 in an intermediate mounting step of manufacture in a second embodiment of the present invention.

Referring now to FIG. 11, therein is shown the structure of FIG. 4 in an intermediate mounting step of manufacture in a second embodiment of the present invention.

The bottom die 207 is attached to the base substrate 101 below the central opening 106 and partially covering the central opening 106.

The base substrate 101 has the base top surface 102 and the base bottom surface 202. The bottom die 207 is attached to the base substrate 101 using the first attachment material 310, such as a die attach adhesive.

Figure 12:
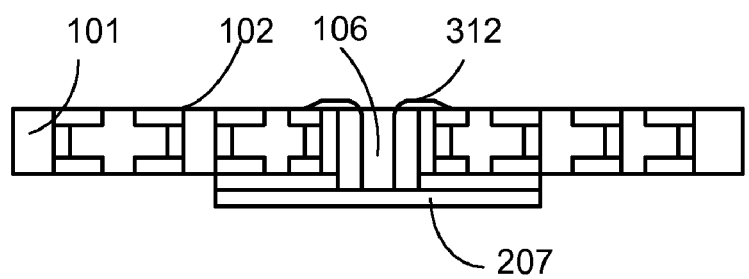
FIG. 12 is the structure of FIG. 11 in a wire bonding step of manufacture.

Referring now to FIG. 12, therein is shown the structure of FIG. 11 in a wire bonding step of manufacture.

The bottom die 207 is electrically coupled the base substrate 101 using the bottom die electrical interconnections 312, such as bond wires. The bottom die electrical interconnections 312 are directed from the bottom die active side 308 of the bottom die 207 to the base top surface 102 of the base substrate 101 through the central opening 106.

Figure 13:
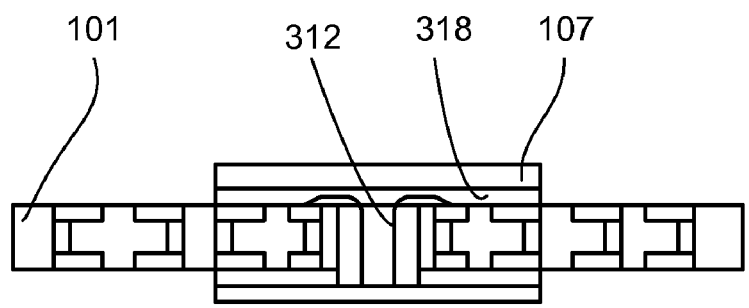
FIG. 13 is the structure of FIG. 12 in a die attach step of manufacture.

Referring now to FIG. 13, therein is shown the structure of FIG. 12 in a die attach step of manufacture.

The top die 107 is attached to the base substrate 101 using the first wire-in-film adhesive 318.

The first wire-in-film adhesive 318 has a low viscosity and, as temperature increases, the viscosity gets lower. The first wire-in-film adhesive 318 is made of a B-stage material that can be hardened after curing and can maintain a predetermined thickness. The bottom die electrical interconnections 312 are partially embedded in the first wire-in-film adhesive 318.

Figure 14:
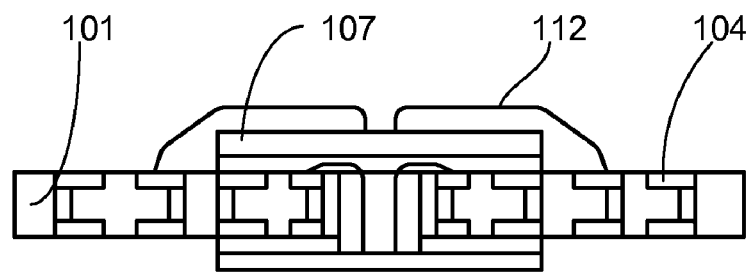
FIG. 14 is the structure of FIG. 13 in a wire bonding step of manufacture.

Referring now to FIG. 14, therein is shown the structure of FIG. 13 in a wire bonding step of manufacture.

The top die 107 is electrically coupled to the bond fingers 104 of the base substrate 101 using the top die electrical interconnections 112 from the center of the top die 107.

Figure 15:
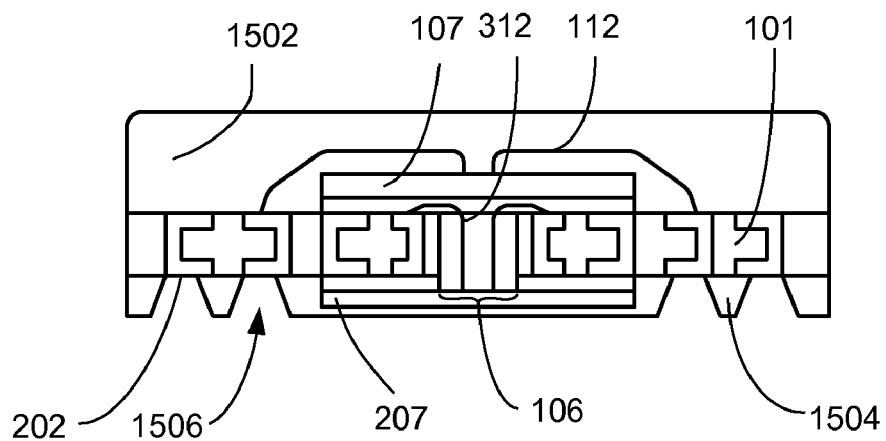
FIG. 15 is the structure of FIG. 14 in an encapsulation step of manufacture.

Referring now to FIG. 15, therein is shown the structure of FIG. 14 in an encapsulation step of manufacture.

An encapsulant 1502 is molded to encapsulate the top die 107, the bottom die 207, and the top die electrical interconnections 112, filling the central opening 106. The encapsulant 1502 also partially encloses the bottom die electrical interconnections 312.

In this encapsulation method, the base substrate 101 having all the components mounted on is inverted and loaded onto a bottom mold case. The top mold case has protrusions on the surface facing the base bottom surface 202 of the base substrate 101 as the base substrate 101 is loaded in an inverted position on the bottom mold case.

The protrusions in the top mold case form protrusions 1504 and channels 1506 in the encapsulant 1502 molded on the base bottom surface 202 of the base substrate 101. The channels 1506 have the shape and the size of the protrusions in the top mold case. The protrusions 1504 have the shape and the size of the channels formed between two adjacent protrusions in the top mold case. The protrusions 1504 and the channels 1506 formed in the encapsulant 1502 are created in an alternate sequence with each other, where every one of the protrusions 1504 is neighbored by one of the channels 1506. It can be said that the channels 1506 are mirror images of the protrusions 1504 and vice versa, with the protrusions 1504 solid and the channels 1506 empty cavities.

The protrusions 1504 may be of a trapezoidal shape having larger dimensions at the top and narrower towards the bottom of the protrusions 1504 for ease of manufacturing and for enclosing the external conductive interconnections 206 in a further step of manufacture.

Figure 16:
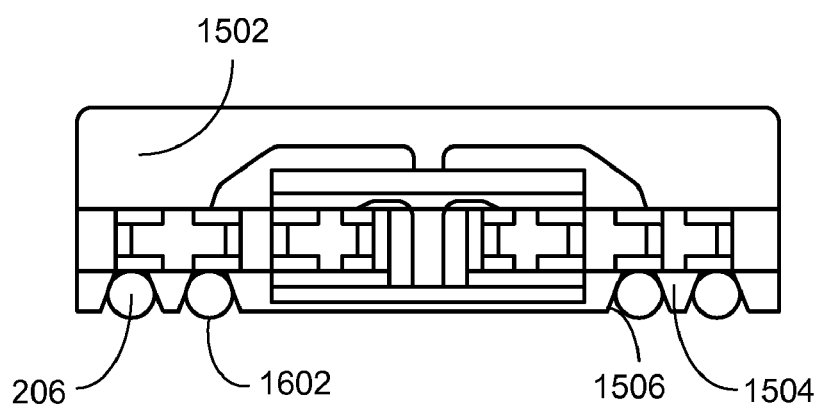
FIG. 16 is the structure of FIG. 15 in a solder ball mount step of manufacture in the second embodiment of the present invention.

Referring now to FIG. 16, therein is shown the structure of FIG. 15 in a solder ball mount step of manufacture in the second embodiment of the present invention.

In the solder ball mount step of manufacture, the external conductive interconnections 206 are mounted into the channels 1506 created in the encapsulant 1502, such that the external conductive interconnections 206 are separated from each other by the protrusions 1504 in an alternating sequence.

The protrusions 1504 only partially cover the external conductive interconnections 206, such that the external conductive interconnections 206 have exposed surfaces 1602 to allow electrical and mechanical attachment to the next level of system, such as a printed circuit board (not shown).

Figure 17:
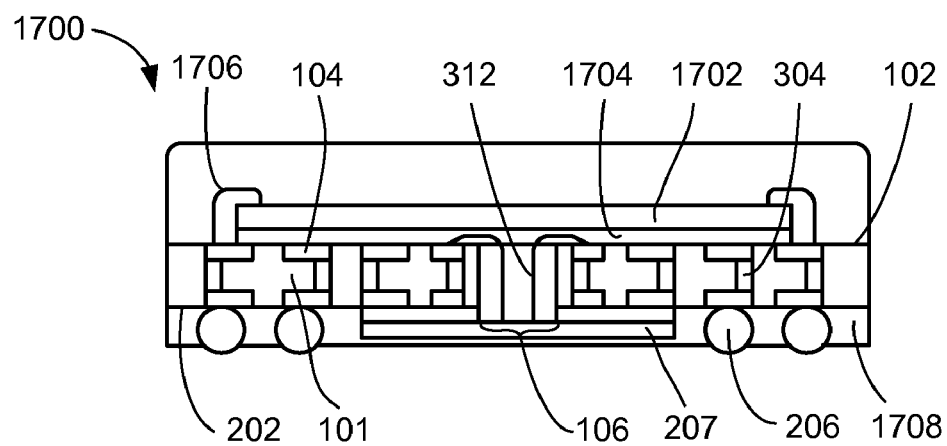
FIG. 17 is a cross-sectional view of an integrated circuit package-on-package system in a third embodiment of the present invention.

Referring now to FIG. 17, therein is shown a cross-sectional view of an integrated circuit package-on-package system 1700 in a third embodiment of the present invention.

The integrated circuit package-on-package system 1700 includes the base substrate 101 having the bond fingers 104 on the base top surface 102, and the base electrical connectors 304, such as metallic vias within the base substrate 101.

The base substrate 101 has the external conductive interconnections 206 on the base bottom surface 202 to provide electrical connection between the base substrate 101 and the next level of system, such as a printed circuit board (not shown).

The bottom die 207 is attached to the base substrate 101 using the first attachment material 310, such as a thermally conductive adhesive. The bottom die 207 is electrically coupled to the base substrate 101 using the bottom die electrical interconnections 312, such as bond wires. The bottom die electrical interconnections 312 are directed from the bottom die active side 308 through the central opening 106 of the base substrate 101 to the base top surface 102 of the base substrate 101.

A top die 1702 is placed over the base top surface 102 of the base substrate 101 such that the top die 1702 partially closes the top of the central opening 106. For the present embodiment, the top die 1702 has a larger footprint than the bottom die 207 covering most of the base top surface 102 of the base substrate 101.

The top die 1702 is attached to the base top surface 102 using a first wire-in-film adhesive 1704. The first wire-in-film adhesive 1704 has a low viscosity and, as temperature increases, the viscosity gets lower. The first wire-in-film adhesive 1704 is made of a B-stage material that can be hardened after curing and can maintain a predetermined thickness. The bottom die electrical interconnections 312 are partially embedded in the first wire-in-film adhesive 1704.

The top die 1702 is electrically connected to the bond fingers 104 of the base top surface 102 using top die electrical interconnections 1706, such as bond wires, from the edges of the top die 1702. This arrangement permits the top die electrical interconnections 1706 to be extremely short compared to other embodiments.

An encapsulant 1708 is molded to encapsulate the top die 1702, the bottom die 207, the top die electrical interconnections 1706, partially encapsulate the bottom die electrical interconnections 312, and partially encapsulate the external conductive interconnections 206. The encapsulant 1708 fills the central opening 106.

Figure 18:
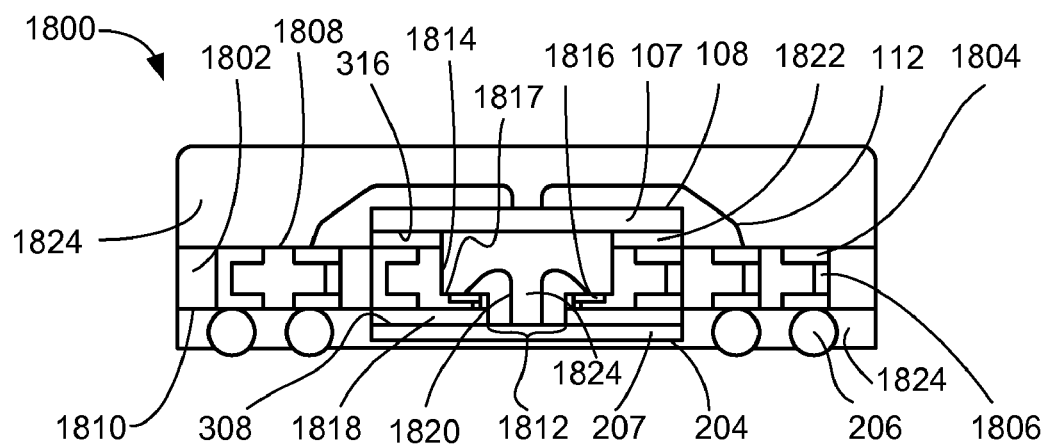
FIG. 18 is a cross-sectional view of an integrated circuit package-on-package system in a fourth embodiment of the present invention.

Referring now to FIG. 18, therein is shown a cross-sectional view of an integrated circuit package-on-package system 1800 in a fourth embodiment of the present invention.

The integrated circuit package-on-package system 1800 includes a base substrate 1802, having bond fingers 1804 and base electrical connectors 1806.

The base substrate 1802, having a base top surface 1808 and a base bottom surface 1810, can be made of different materials, such as laminate substrate, ceramic, metal leadframe, or other materials.

The base bottom surface 1810 of the base substrate 1802 has the external conductive interconnections 206 to provide electrical connection between the base substrate 1802 and the next level of system, such as a printed circuit board (not shown).

A central opening 1812, which may be of rectangular shape, is cut in the central area of the base substrate 1802.

A trench 1814 is formed parallel to the central opening 1812 from the base top surface 1808 to the base bottom surface 1810. The trench 1814 may also be of rectangular shape. The depth of the trench 1814 is less than the thickness of the base substrate 1802.

Substrate contact pads 1816 on the top surface 1817 of the base substrate 1802 at the bottom of the trench 1814 connect to the base electrical connectors 1806.

The bottom die 207 is attached to the base substrate 1802 using a second attachment material 1818, such as a thermally conductive adhesive.

The bottom die 207 is electrically coupled to the substrate contact pads 1816 using bottom die electrical interconnections 1820, such as bond wires. This allows the bottom die electrical interconnections 1820 to be extremely short.

The top die 107 is mounted above the base substrate 1802. The top die non-active side 316 is attached to the base substrate 1802 using a first attachment material 1822, such as a thermally conductive adhesive. The central area of the top die active side 108 is electrically coupled to the base top surface 1808 of the base substrate 1802 using the top die electrical interconnections 112.

It has been found that top packages, such as memory devices, having stacked die configuration may be mounted over the base substrate 1802 instead of the top die 107.

An encapsulant 1824 is used to encapsulate the top die 107, the bottom die 207, the top die electrical interconnections 112, the bottom die electrical interconnections 1820, and partially encapsulate the external conductive interconnections 206. The encapsulant 1824 fills the central opening 1812 and the trench 1814.

Figure 19:
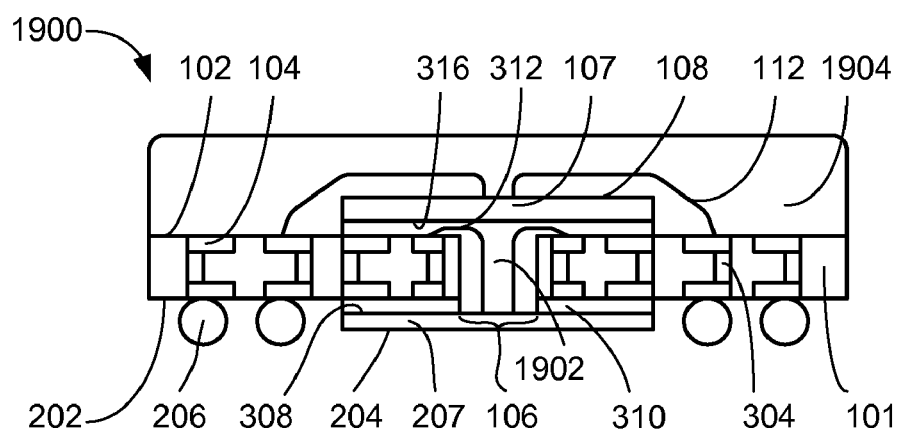
FIG. 19 is a cross-sectional view of an integrated circuit package-on-package system in a fifth embodiment of the present invention.

Referring now to FIG. 19, therein is shown a cross-sectional view of an integrated circuit package-on-package system 1900 in a fifth embodiment of the present invention.

The integrated circuit package-on-package system 1900 includes the base substrate 101 having the bond fingers 104 on the base top surface 102, and the base electrical connectors 304, such as metallic vias within the base substrate 101.

The base bottom surface 202 of the base substrate 101 has the external conductive interconnections 206 to provide electrical connection between the base substrate 101 and the next level of system, such as a printed circuit board (not shown).

The bottom die 207, having the bottom die active side 308 and the bottom die non-active side 204, is mounted on the base bottom surface 202 of the base substrate 101. The bottom die 207 is attached to the base substrate 101 using the first attachment material 310, such as a thermally conductive adhesive. The bottom die 207 is electrically coupled to the base substrate 101 using the bottom die electrical interconnections 312, such as bond wires. The bottom die electrical interconnections 312 are directed from the bottom die active side 308 through the central opening 106 to the base top surface 102 of the base substrate 101.

The top die 107 having the top die active side 108 and the top die non-active side 316. The top die active side 108 is electrically coupled to the base top surface 102 of the base substrate 101 using the top die electrical interconnections 112.

The top die 107 is attached to the base substrate 101 using a second wire-in-film adhesive 1902. The second wire-in-film adhesive 1902 can be of a B-stage material that can be hardened after curing and can maintain a predetermined thickness.

The second wire-in-film adhesive 1902 fills the central opening 106 and extends over the base top surface 102 of the base substrate 101 such that the bottom die electrical interconnections 312 are fully embedded in the second wire-in-film adhesive.

An encapsulant 1904 is used to encapsulate the top die 107 and the top die electrical interconnections 112 about to the base top surface 102 of the base substrate 101. The encapsulant 1904 leaves the bottom die 207 and the external conductive interconnections 206 fully exposed. Thus, the encapsulant 1904 covers the base top surface 102 of the base substrate 101 and all the components mounted on it. This type of encapsulation in which only the base top surface 102 of the base substrate 101 is encapsulated by the encapsulant 1904, is called top surface molding.

Figure 20:
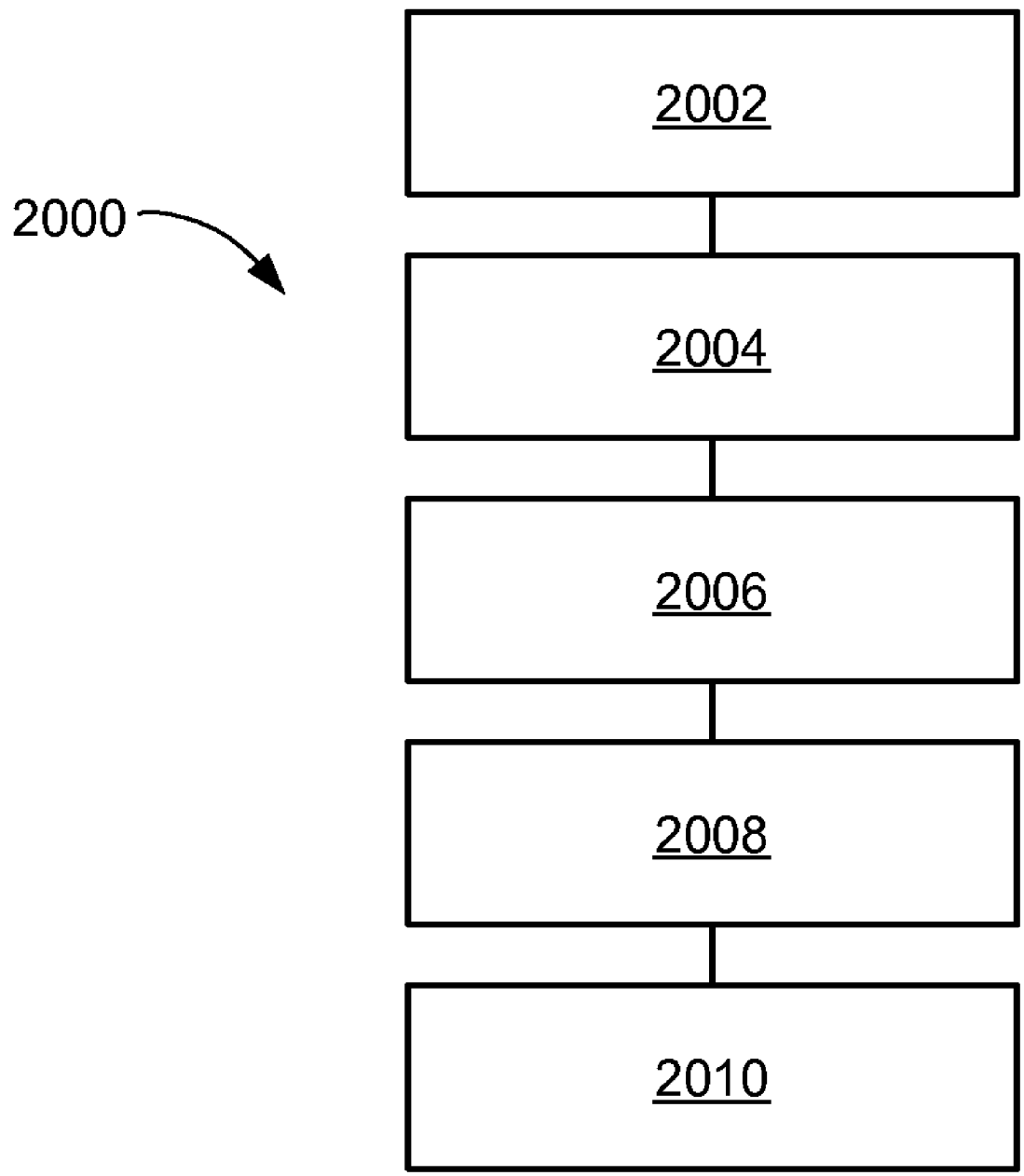
FIG. 20 is a flow chart of an integrated circuit package-on-package system for manufacturing the integrated circuit package-on-package system in an embodiment of the present invention.

Referring now to FIG. 20, therein is shown a flow chart of an integrated circuit package-on-package system 2000 for manufacturing the integrated circuit package-on-package system 100 in an embodiment of the present invention.

The integrated circuit package-on-package system 2000 includes providing a base substrate having a central opening in a block 2002; attaching a bottom die below the base substrate partially covering the central opening, the bottom die connected through the central opening to a top of the base substrate in a block 2004; attaching a top die above the base substrate partially covering the central opening in a block 2006; attaching external conductive interconnections to a base bottom surface of the base substrate in a block 2008; and molding an encapsulant leaving the external conductive interconnections partially exposed in a block 2010.

It has been discovered that the present invention thus has numerous aspects.

A principle aspect that has been unexpectedly discovered is that the present invention reduces the height of the package-on-package system.

Another aspect is that having both the top die electrical interconnections and the bottom die electrical interconnections attached to the bond fingers of the base substrate, the length of the conductive traces on the base substrate can be reduced and the input/output count of the substrate can be simplified.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package-on-package system of the present invention furnishes important and heretofore unknown and unavailable solutions, capabilities, and functional aspects for manufacturing stacked integrated circuit package systems.

The resulting processes and configurations are straightforward, cost-effective, uncomplicated, highly versatile and effective, can be surprisingly and unobviously implemented by adapting known technologies, and are thus readily suited for efficiently and economically manufacturing stacked package systems fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package-on-package system comprising:
   providing a base substrate having a central opening;
   attaching a bottom die below the base substrate partially covering the central opening, the bottom die connected through the central opening to a top surface of the base substrate;
   attaching a top die above the base substrate partially covering the central opening with a first wire-in-film adhesive;
   attaching external conductive interconnections to a base bottom surface of the base substrate; and
   molding an encapsulant leaving the external conductive interconnections partially exposed.

2. The system as claimed in claim 1 wherein attaching the bottom die to the base substrate comprises attaching the bottom die to the base substrate using a first attachment material.

3. The system as claimed in claim 1 wherein the base substrate provides a central opening having a trench therein.

4. The system as claimed in claim 1 wherein molding the encapsulant comprises:
   forming the encapsulant having channels; and
   placing the external conductive interconnections into the channels.

5. An integrated circuit package-on-package system comprising:
   providing a base substrate having a central opening;
   attaching a bottom die below the base substrate using a first attachment material;
   connecting the bottom die through the central opening to a top surface of the base substrate using bottom die electrical interconnections;
   attaching a top die above the base substrate using a first wire-in-film adhesive;
   mounting external conductive interconnections on a base bottom surface of the base substrate;
   connecting the top die to the base substrate using top die electrical interconnections; and
   molding an encapsulant over the bottom die and the top die.

6. The system as claimed in claim 5 wherein connecting the bottom die to the base substrate comprises:
   connecting the bottom die to the base substrate using bottom die electrical interconnections; and
   maintaining a clearance between the bottom die electrical interconnections and a top die non-active side of the top die.

7. The system as claimed in claim 5 wherein attaching the top die to the base substrate comprises attaching the top die using the first wire-in-film adhesive having the bottom die electrical interconnections partially embedded in the first wire-in-film adhesive.

8. The system as claimed in claim 5 wherein attaching the top die to the base substrate includes attaching the top die to the base substrate using a second wire-in-film adhesive with the bottom die electrical interconnections fully embedded in the second wire-in-film adhesive.

9. The system as claimed in claim 5 wherein molding the encapsulant includes forming the encapsulant to about a base top surface surrounding the top die, the top die electrical interconnections, leaving the bottom die and the external conductive interconnections fully exposed.

10. An integrated circuit package-on-package system comprising:
   a base substrate with a central opening;
   a bottom die attached below the base substrate partially covers the central opening, the bottom die connected through the central opening to a top surface of the base substrate;
   a top die above the base substrate partially covers the central opening;
   a first wire-in-film adhesive attaches the top die to the base substrate;
   external conductive interconnections attached to a base bottom surface of the base substrate; and
   an encapsulant molded around the top die and the bottom die leaves the external conductive interconnections partially exposed.

11. The system as claimed in claim 10 wherein the bottom die is attached to the base substrate.

12. The system as claimed in claim 10 wherein the base substrate provides a central opening having a trench therein entered on the central opening.

13. The system as claimed in claim 10 wherein:
   the encapsulant includes protrusions and channels; and
   the external conductive interconnections are in the channels.

14. The system as claimed in claim 10 wherein:
   the bottom die is attached to the base substrate using a first attachment material and electrically connected to the top surface of the base substrate using bottom die electrical interconnections; and
   the top die is attached to the base substrate using a first wire-in-film adhesive and electrically connected to the base top surface of the base substrate using top die electrical interconnections.

15. The system as claimed in claim 14 wherein the bottom die electrical interconnections maintain a clearance with a top die non-active side of the top die.

16. The system as claimed in claim 14 wherein the top die attaches to the base substrate using the first wire-in-film adhesive with the bottom die electrical interconnections partially embedded in the first wire-in-film adhesive.

17. The system as claimed in claim 14 wherein the top die attaches to the base substrate using a second wire-in-film adhesive with the bottom die electrical interconnections fully embedded in the second wire-in-film adhesive.

18. The system as claimed in claim 14 wherein the encapsulant leaves the external conductive interconnections partially exposed.

19. The system as claimed in claim 10 wherein the top die is attached to the base substrate with a first wire-in-film adhesive.

20. An integrated circuit package-on-package system comprising:
   providing a base substrate having a central opening;
   attaching a bottom die below the base substrate partially covering the central opening, the bottom die connected through the central opening to a top surface of the base substrate;
   attaching a top die above the base substrate partially covering the central opening;
   attaching external conductive interconnections to a base bottom surface of the base substrate; and
   molding an encapsulant around the top die and external conductive interconnections by flowing through the central opening but leaving the external conductive interconnections partially exposed.

21. The system as claimed in claim 20 wherein attaching the top die to the base substrate includes attaching the top die to the base substrate using a first wire-in-film adhesive.

22. An integrated circuit package-on-package system comprising:
   a base substrate with a central opening;
   a bottom die attached below the base substrate partially covers the central opening, the bottom die connected through the central opening to a top surface of the base substrate;
   a top die above the base substrate partially covers the central opening;
   external conductive interconnections attached to a base bottom surface of the base substrate; and
   an encapsulant molded around the top die and the bottom die and through the central opening and leaves the external conductive interconnections partially exposed.

* * * * *